(12) United States Patent
Burns et al.

(10) Patent No.: US 7,900,776 B2
(45) Date of Patent: Mar. 8, 2011

(54) WAFER CONTAINER WITH DOOR ACTUATED WAFER RESTRAINT

(75) Inventors: John Burns, Colorado Springs, CO (US); Matthew A. Fuller, Colorado Springs, CO (US); Jeffery J. King, Colorado Springs, CO (US); Martin L. Forbes, Divide, CO (US); Mark V. Smith, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 258 days.

(21) Appl. No.: 11/514,796

(22) Filed: Sep. 1, 2006

(65) Prior Publication Data

US 2006/0289333 A1     Dec. 28, 2006

Related U.S. Application Data

(62) Division of application No. 10/989,232, filed on Nov. 15, 2004, now Pat. No. 7,100,772.

(60) Provisional application No. 60/520,817, filed on Nov. 16, 2003.

(51) Int. Cl.
*B65D 85/00* (2006.01)
(52) U.S. Cl. .......................................... 206/711; 206/723
(58) Field of Classification Search .......... 206/710–712, 206/722–724, 454, 832, 445; 414/416.08, 414/937; 211/41.14, 41.18, 43, 41.1
See application file for complete search history.

(56) References Cited

U.S. PATENT DOCUMENTS

| | | | | |
|---|---|---|---|---|
| 2,056,279 A * | 10/1936 | Kulick | ........................... | 378/187 |
| 4,043,451 A | 8/1977 | Johnson | | |
| 4,520,925 A | 6/1985 | Johnson | | |
| 4,747,484 A * | 5/1988 | Ackeret | ........................ | 206/309 |
| 4,842,136 A * | 6/1989 | Nakazato et al. | ............. | 206/454 |
| 5,024,329 A | 6/1991 | Grohrock | | |
| 5,253,755 A | 10/1993 | Maenke | | |
| 5,255,797 A * | 10/1993 | Kos | ............................ | 211/41.18 |
| 5,265,721 A * | 11/1993 | Castritis | .................... | 206/308.1 |
| 5,452,795 A | 9/1995 | Gallagher et al. | | |
| 5,555,981 A | 9/1996 | Gregerson | | |
| 5,711,427 A | 1/1998 | Nyseth | | |
| 5,743,409 A * | 4/1998 | Nakahara et al. | ............. | 206/710 |
| 5,749,469 A | 5/1998 | Williams | | |
| 5,782,362 A | 7/1998 | Ohori | | |
| 5,785,186 A * | 7/1998 | Babbs et al. | ............... | 211/41.18 |

(Continued)

FOREIGN PATENT DOCUMENTS

EP     0735572 B1     10/1996

(Continued)

*Primary Examiner* — Mickey Yu
*Assistant Examiner* — Melissa L Lalli
(74) *Attorney, Agent, or Firm* — Patterson Thuente Christensen Pedersen, P.A.

(57) ABSTRACT

A container for holding a wafer includes an enclosure portion having a top, a bottom, a pair of opposing sides, a back and an opposing open front defined by a door frame. A door is sealingly engagable in the door frame to close the open front. The container further includes wafer restraint means in the enclosure including fixed wafer restraint means and operable wafer restraint means. The operable wafer restraint means is selectively positionable by engaging and disengaging the door from the door frame, and is positioned so to enable insertion or removal of a wafer from the container when the door is disengaged from the door frame and positioned so as to cooperate with the fixed wafer restraint means to restrain the wafer in the container when the door is engaged in the door frame.

14 Claims, 5 Drawing Sheets

U.S. PATENT DOCUMENTS

| | | | |
|---|---|---|---|
| 5,853,214 A | 12/1998 | Babbs et al. | |
| 5,915,562 A | 6/1999 | Nyseth et al. | |
| 5,960,959 A | 10/1999 | Wu et al. | |
| 5,960,960 A | 10/1999 | Yamamoto | |
| 6,003,674 A | 12/1999 | Brooks | |
| 6,082,540 A * | 7/2000 | Krampotich et al. | 206/445 |
| 6,591,987 B2 * | 7/2003 | Wu et al. | 206/454 |
| 7,100,772 B2 | 9/2006 | Burns et al. | |
| 2005/0224391 A1 * | 10/2005 | Bores et al. | 206/710 |

FOREIGN PATENT DOCUMENTS

| | | |
|---|---|---|
| JP | 1-160442 | 11/1989 |
| JP | 03-257845 | 11/1991 |
| JP | 2001-035911 | 2/2001 |
| WO | WO 03/072460 A1 | 9/2003 |

\* cited by examiner

US 7,900,776 B2

WAFER CONTAINER WITH DOOR ACTUATED WAFER RESTRAINT

RELATED APPLICATIONS

This application is a Divisional Application of U.S. patent application Ser. No. 10/989,232, filed Nov. 15, 2004 now U.S. Pat. No. 7,100,772, which claims the benefit of U.S. Provisional Patent Application No. 60/520,817, filed Nov. 16, 2003, both hereby fully incorporated herein by reference.

FIELD OF THE INVENTION

This application relates to sealable wafer containers, and more specifically to wafer support and restraining means in wafer containers.

BACKGROUND OF THE INVENTION

Semiconductor wafers have become larger in scale, now with fabrication facilities commonly utilizing 300 mm wafers to be manufactured into semiconductor devices such as integrated circuits. The integrated circuits themselves have become larger in size with increasing circuit densities. As a consequence, the size of particulate contaminants that can destroy a circuit have decreased significantly, and strict particulate control is necessary during all phases of manufacturing, processing, transporting, and storage of semiconductor wafers.

In order to inhibit contamination by particulates during storage, processing, and handling operations, wafers are commonly stored and transported in sealed front-opening wafer containers that have a door secured by latches on the open front. The door can be typically removed manually or robotically. Such wafer containers are known in the industry as FOUPs, which is an acronym for front-opening unified pod, and FOSBs, an acronym for front-opening shipping box. Examples of such containers are generally disclosed in U.S. Pat. Nos. 6,644,477; 6,267,245; 6,216,874; 6,206,196; 6,010,008; and 5,944,194, all of which are commonly owned by the owners of the present invention and which are hereby fully incorporated herein by reference.

The doors on these types of containers are operated with robotic interfaces that have precisely positioned keys that insert into the front of the door to operate latching mechanisms to remove and place the door with respect to the container portion.

Semiconductor wafers are typically very thin and brittle. As a consequence, it is highly desirable wafers are firmly restrained in the container to inhibit movement. Further, the wafers should be cushioned against shocks that may cause breakage of the wafer.

Prior art containers typically have one or more wafer cushioning support or restraint structures fixed in the enclosure. These fixed structures may be supplemented by one or more wafer cushions fixed on the door, which provide support to the wafers when the door is engaged with the container. Most commonly, two fixed supports are spaced apart in the enclosure and one support is provided on the door so that wafers are supported at three roughly evenly spaced-apart locations.

While prior containers are generally satisfactory for most uses, it is desirable in some cases, particularly in wafer containers for single wafers, to provide additional support along the edge of the wafer facing the door to alleviate unsatisfactory deflection and movement of the wafer. What is needed in the industry is an alternative wafer cushioning means that enables firm support and cushioning along the front edge of a wafer.

SUMMARY OF THE INVENTION

The present invention meets the need of the industry for a wafer container with alternative wafer cushioning means that enables firm support and cushioning along the front edge of a wafer. According to an embodiment of the invention a container for holding a wafer includes an enclosure portion having a top, a bottom, a pair of opposing sides, a back and an opposing open front defined by a door frame. A door is sealingly engagable in the door frame to close the open front. The container further includes wafer restraint means in the enclosure including fixed wafer restraint means and operable wafer restraint means. The operable wafer restraint means is selectively positionable by engaging and disengaging the door from the door frame, and is positioned so to enable insertion or removal of a wafer from the container when the door is disengaged from the door frame and positioned so as to cooperate with the fixed wafer restraint means to restrain the wafer in the container when the door is engaged in the door frame.

In one embodiment, the wafer restraint means includes a generally c-shaped wafer support having a pair of opposing branches, each branch having a first end fixedly coupled to the back of the enclosure portion and a second opposing end cantilevered therefrom. Each branch includes a forward wafer engaging portion proximate the second end, and the wafer restraint system further includes an actuator disposed so as to engage and urge the second ends of the branches inwardly when the door is engaged with the enclosure portion.

In another embodiment of the invention, the operable wafer restraint means includes an arm pivotally coupled with the enclosure portion. The arm may include a first end having a door contacting portion and a second opposing end having a wafer contacting portion. The arm may further have a spring operably coupled between the enclosure portion and the arm for biasing the arm toward the first position.

DETAILED DESCRIPTION OF THE PREFERRED EMBODIMENTS

Figure 1:
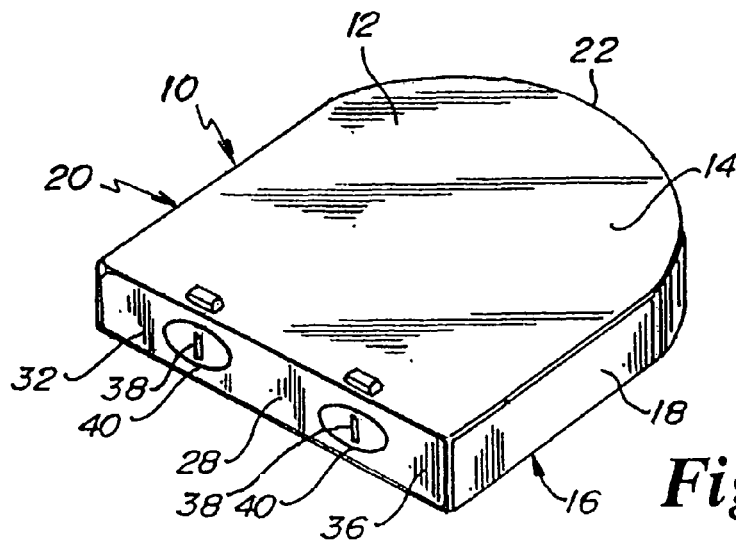
FIG. 1 is a perspective view of a front-opening wafer container for holding a single wafer.
Figure 2:
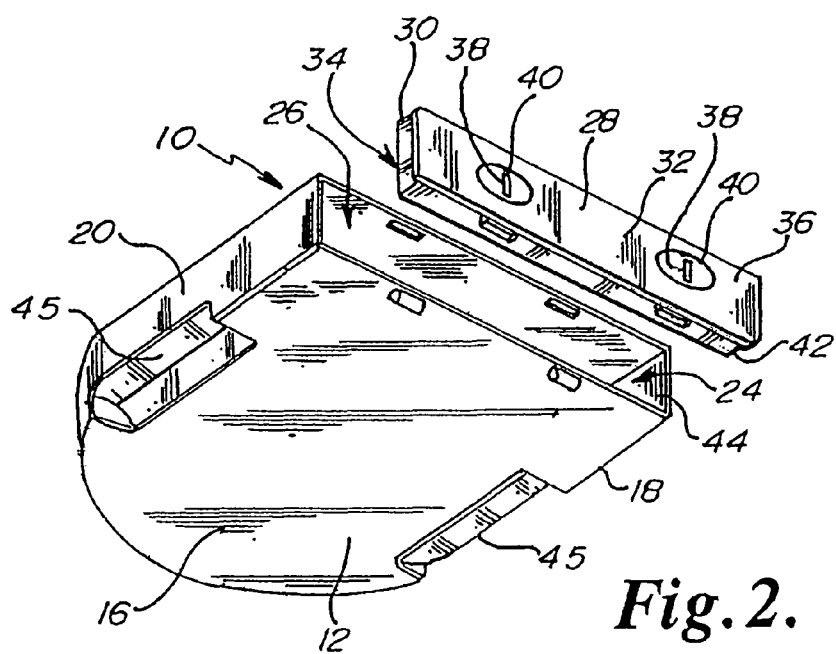
FIG. 2 is a perspective view of an alternative embodiment of a front-opening wafer container for holding a single wafer.

Referring to FIGS. 1 and 2, a front opening wafer container 10 for holding a single wafer according to embodiments of the invention generally includes an enclosure portion 12, having a top 14, a bottom 16, a pair of opposing sides 18, 20, a back 22 and an open front 24, enclosing an open interior 26. Wafer container 10 further generally includes door 28 for sealingly closing open front 24. Door 28 generally includes chassis 30 having a front or exterior side 32, and a back or interior side 34. Front side 32 includes panel 36 covering one or more latching mechanisms 38, which are operated through keyholes 40 defined in panel 36. Further details of latching mechanisms 38 are disclosed in co-pending U.S. Utility patent application Ser. No. 10/998,933, entitled WAFER CONTAINER AND DOOR WITH CAM LATCHING MECHANISM, filed on the same day as the present application and hereby fully incorporated herein by reference. Sealing means (not depicted) may be provided at periphery 42 of door 28 to sealingly engage with door frame 44 in enclosure portion 12.

Figure 3:
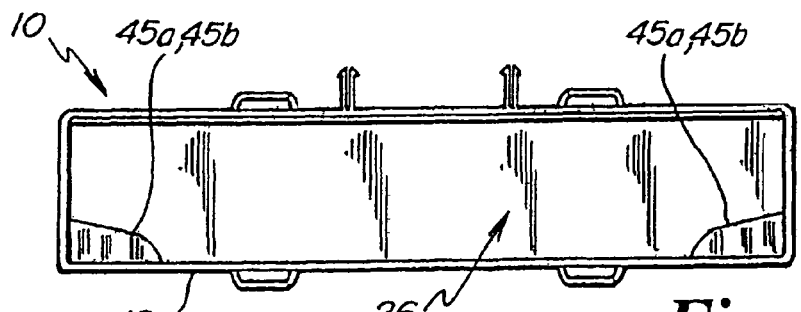
FIG. 3 is a front elevation view of the wafer container of FIG. 2 with the door removed.

In the embodiment of FIGS. 2 and 3, hand grips 45 are provided on the exterior of enclosure portion 12 to enable the container 10 to be easily handled. The interior surface 45a of these hand grips 45 may double as a fixed wafer support surface 45b in the container 10.

Figure 4:
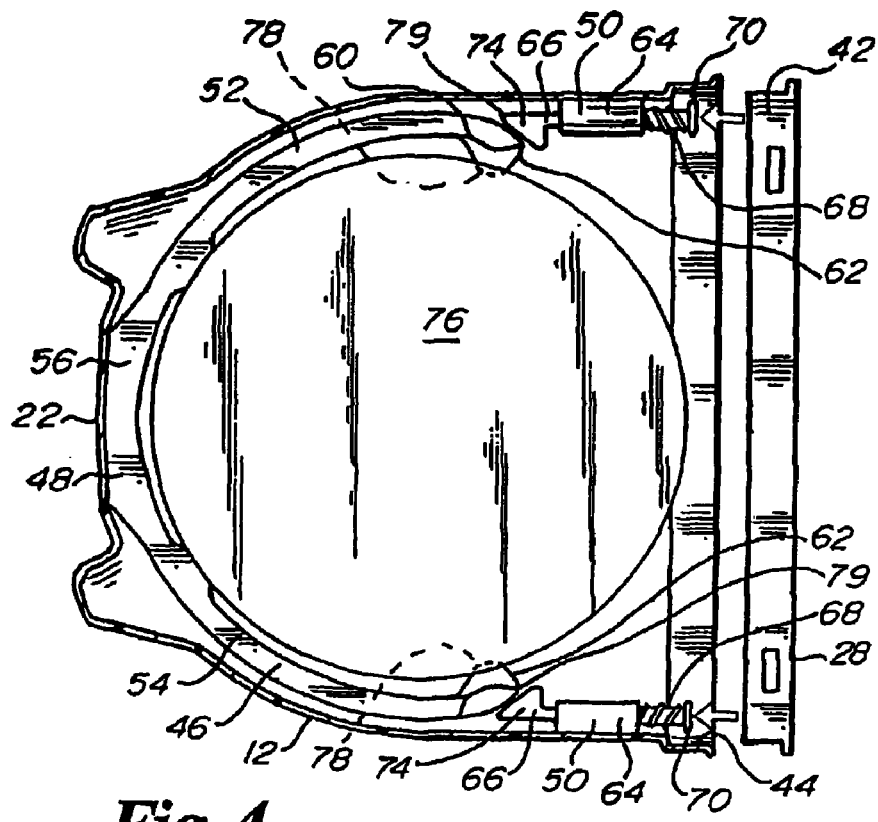
FIG. 4 is a sectional view of an embodiment of a wafer container with a door actuated operable wafer restraint according to the invention with the door disengaged from the enclosure.
Figure 5:
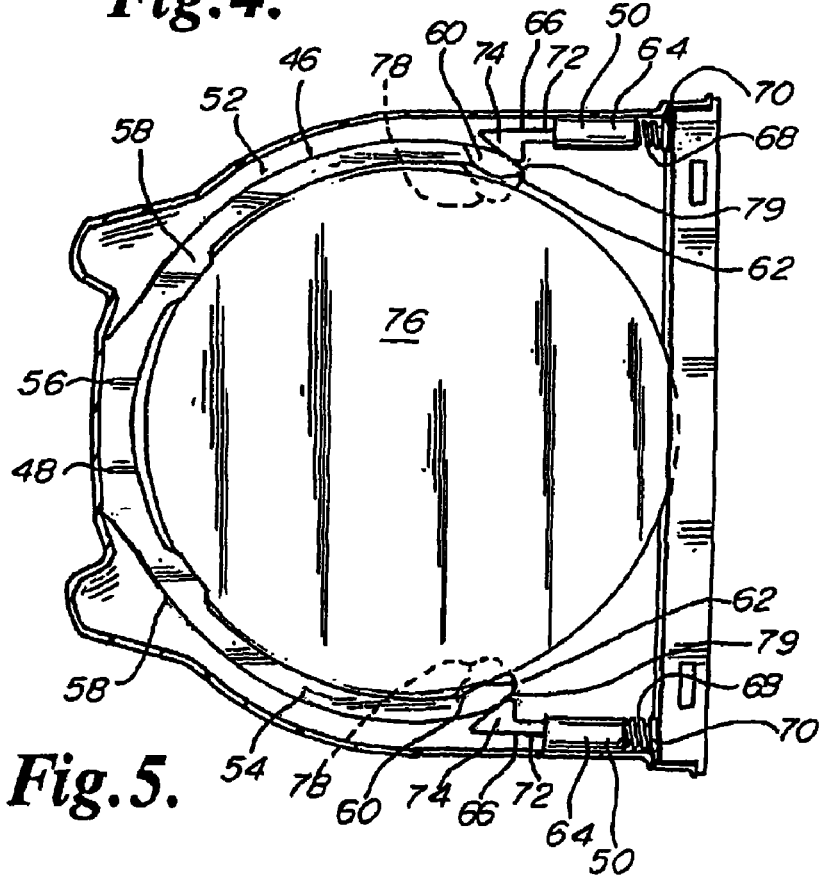
FIG. 5 is a sectional view of the wafer container of FIG. 4 with the door fully engaged with the enclosure.

According to an embodiment of the invention depicted in FIGS. 4 and 5, wafer support and restraint system 46 is positioned in enclosure portion 12, and generally includes wafer support 48 and actuator mechanism 50. Wafer support 48 is generally c-shaped when viewed in plan view as depicted, and includes a pair of branches 52, 54, extending from attachment portion 56, which is fixed to the interior surface of back 22 of enclosure portion 12 so that branches 52, 54, are cantilevered therefrom. Each branch 52, 54 has a rear wafer engaging portion 58 positioned proximate attachment portion 56 and a forward wafer engaging portion 60 positioned proximate the distal end 62 of each branch.

Actuator mechanism 50 generally includes guide 64, piston 66, and return spring 68. Guide 64 defines a bore (not depicted) in which piston 66 is slidably disposed. Piston 66 generally includes head 70, intermediate shaft 72 and wedge-shaped support engaging portion 74. Return spring 68 is disposed between guide 64 and head 70.

In operation, wafer 76 may be inserted in enclosure portion 12 with door 28 removed so that the wafer is engaged with rear wafer engaging portions 58 of each branch 52, 54. With door 28 not engaged with enclosure portion 12 as depicted in FIG. 4, distal ends 62 of branches 52, 54, are spread outward slightly away from wafer 76 so that only the inner tips 78 of forward wafer engaging portions 60 are engaged under wafer 76. In this position, wafer 76 is not restrained from moving toward open front 24.

As door 28 is engaged with enclosure portion 12 in the direction of the arrows as depicted in FIG. 4, interior side 34 of door 28 engages head 70 of each piston 66. As door 28 is moved into engagement in door frame 44, pistons 66 slide in guides 64 inwardly into enclosure portion 12, and return springs 68 are compressed as heads 70 move toward guides 64. As pistons 66 move further inward, wedge shaped support engaging portions 74 engage sloped outer edge 79 of branches 52, 54, forcing distal ends 62 toward wafer 76, and engaging forward wafer engaging portions 58 around wafer 76. In the fully engaged position depicted in FIG. 5, wafer 76 is restrained from moving toward open front 24 by forward wafer engaging portions 58.

Door 28 may be disengaged from enclosure portion 12 whenever it is desired to remove wafer 76 from the container. As door 28 is moved out of door frame 44, return springs 68, decompress, urging heads 70 outward away from guides 64 and returning pistons 66 to the position depicted in FIG. 4. In turn, as wedge shaped support engaging portions 74 disengage from sloped outer edge 78 of branches 52, 54, distal ends 62 and forward wafer engaging portions 58 spring outward away from wafer 76 returning to the position depicted in FIG. 4.

As an alternative to actuator mechanism 50, a structure similar to piston 66 may be fixed directly to door 28 at the appropriate location to engage sloped outer edge 79 of branches 52, 54, so as to deflect distal ends 62 inwardly as door 28 is engaged with enclosure portion 12 as described above. While requiring relatively greater precision in aligning door 28 with the container during engagement, this embodiment offers the advantage of an actuator without moving parts.

Figure 6:
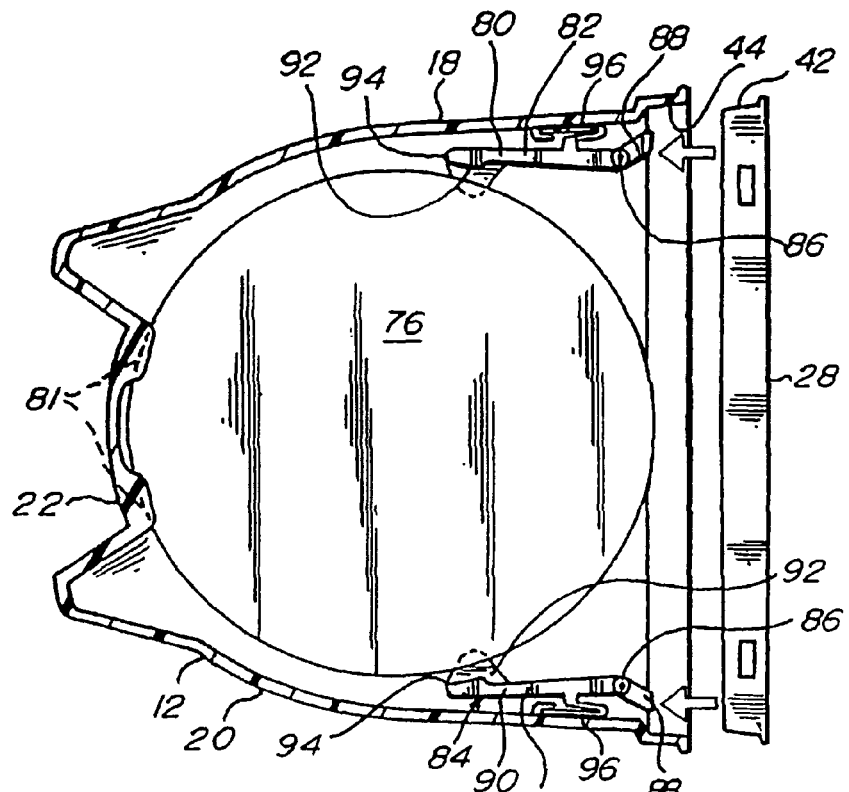
FIG. 6 is a sectional view of an alternative embodiment of a wafer container with a door actuated operable wafer restraint according to the invention with the door disengaged from the enclosure.
Figure 7:
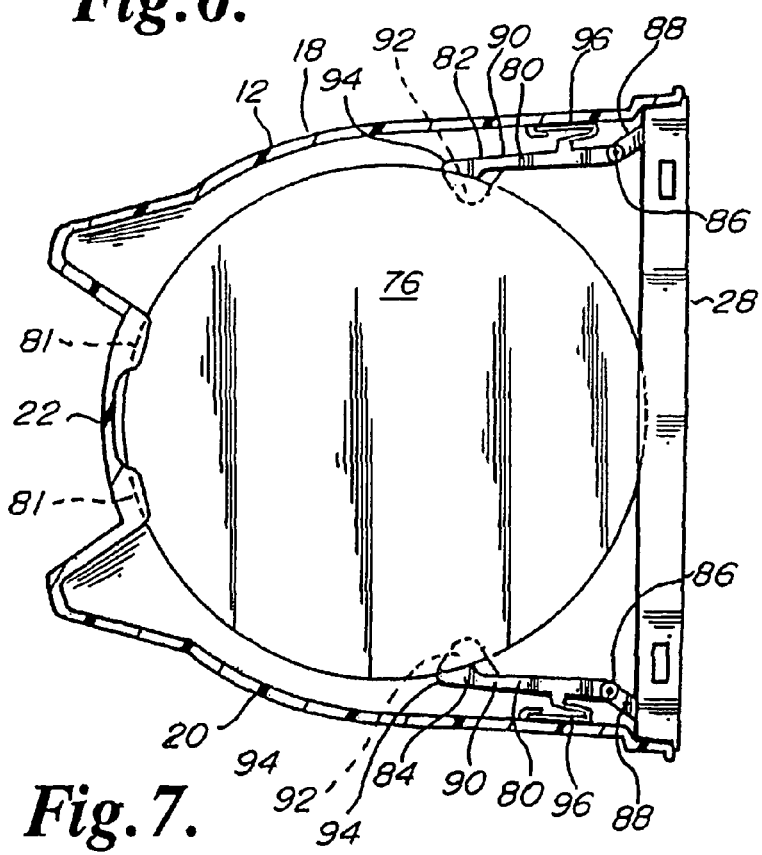
FIG. 7 is a sectional view of the wafer container of FIG. 6 with the door fully engaged with the enclosure.

Another alternative embodiment of the invention is depicted in FIGS. 6 and 7. In this embodiment, wafer support and restraint system 80 generally includes a pair of fixed rear wafer supports 81 on back 22 of enclosure portion 12 and a pair of operable forward wafer supports 82, 84. Each forward wafer support 82, 84, is pivotally mounted to enclosure 12 at pivot 86, and generally includes door engaging portion 88 and arm 90 on opposite sides of pivot 86. Arm 90 has wafer engaging portion 92 at distal end 94. Springs 96 are coupled between each arm 90 and sides 18, 20, to locate arm 90 in the proper position for insertion of wafer 76 when door 28 is removed from the container, and to provide a biasing force tending to pull arm 90 toward the sides 18, 20, when distal ends 94 are moved inward toward wafer 76. Door 28 may have a pad 98 thereon for receiving door engaging portion 88.

In operation, wafer 76 may be inserted in enclosure portion 12 with door 28 removed so that the wafer is engaged with rear wafer supports 80. With door 28 not engaged with enclosure portion 12 as depicted in FIG. 6, distal ends 94 of each arm 90 are positioned proximate sides 18, 20, so as not to interfere with insertion or removal of the wafer. In this position, wafer 76 is not restrained from moving toward the open front 24.

As door 28 is engaged with enclosure portion 12 in the direction of the arrows as depicted in FIG. 6, pads 98 on door 28 engage door engaging portions 88 of each forward wafer support 82, 84. As door 28 is moved into engagement in door frame 44, door engaging portions 88 are forced outwardly toward sides 18, 20, causing forward wafer supports 82, 84 to pivot about pivots 86, and distal ends 94 of arms 90 to move inwardly. Wafer engaging portions 92 engage around wafer 76 as door 28 reaches the fully engaged or second position depicted in FIG. 7. In this fully engaged position depicted in FIG. 7, wafer 76 is restrained from moving toward open front 24 by wafer engaging portions 92.

Again, door 28 may be disengaged from enclosure portion 12 whenever it is desired to remove wafer 76 from the container. As door 28 is moved out of door frame 44, pads 98 disengage from door engaging portions 88, enabling forward wafer supports 82, 84, to pivot about pivot 86 and springs 96 to decompress, thereby pulling arms 90 toward sides 18, 20, away from wafer 76. Hence, wafer support and restraint system 80 returns to the position depicted in FIG. 6.

Figure 8:
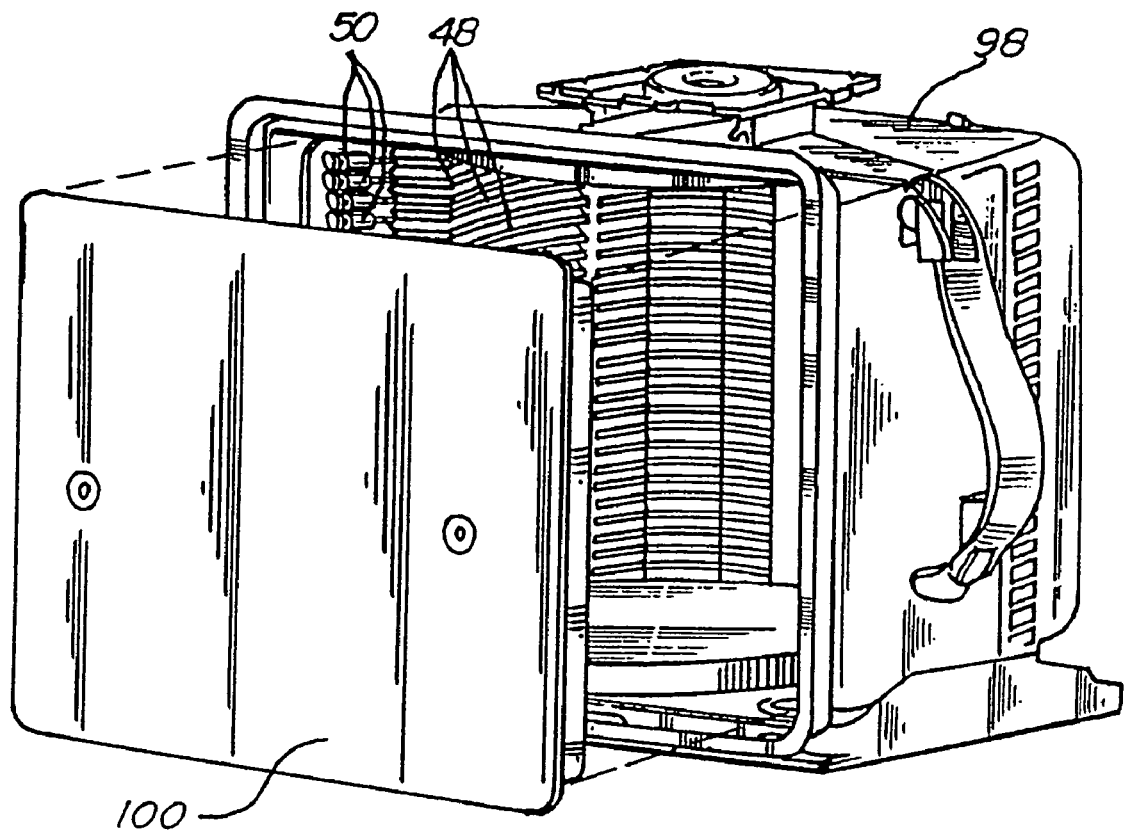
FIG. 8 is a perspective view of a wafer container for multiple wafers with door actuated operable wafer restraints according to the invention.

As depicted in FIG. 8, the present invention may be applied to provide additional support to the front edge of wafers in a multiple wafer container. In the depicted embodiment, a plurality of the cantilevered c-shaped wafer supports 48 described hereinabove is positioned in the container 98, one for each wafer to be held. A plurality of actuating mechanisms 50 is positioned along the sides of the container 98 to actuate the wafer supports 48 when door 100 is engaged with the container. It will be appreciated that the alternative embodiment depicted in FIGS. 6 and 7 may be employed in a multiple wafer carrier in a like manner within the scope of the invention.

Figure 9B:
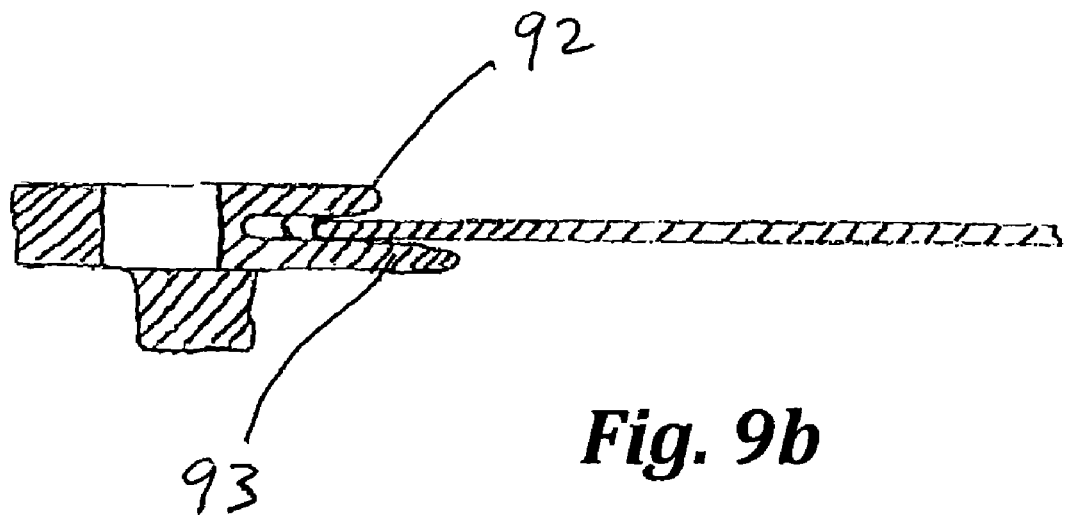
FIGS. 9A and 9B are cross sectional views of a suitable wafer engagement portion including a wafer shelf extending underneath a wafer.
Figure 9A:
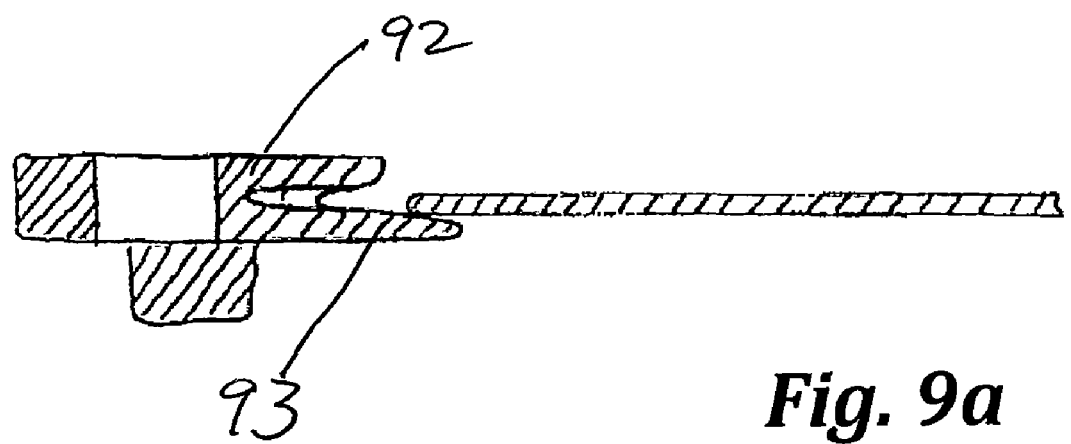

As depicted in FIGS. 9A and 9B, each wafer engaging portion 92 includes a wafer shelf 93 extending underneath the wafer both at the first positions and second positions.

Various components identified herein may be molded from suitable thermoplastic or other material having characteristics suitable for use in wafer containers. Desirable thermoplastics would include polyetheretherketone (PEEK) with carbon fiber filler or carbon powder filler, polyetherimide (PEI), polycarbonate or other suitable thermoplastics as are generally known in the art.

What is claimed is:

1. A combination of a wafer and a wafer container for receiving and holding the wafer horizontally, the wafer container comprising: an enclosure portion having a top, a bottom, a pair of opposing sides, a back and an opposing open front defined by a door frame; a door sealingly engageable with the door frame to close the open front thereby forming a sealed enclosure; a wafer restraint system in the enclosure portion comprising at least one wafer restraint portion attached to and positioned in the back of the enclosure portion and a pair of opposing operable wafer supports, attached to the enclosure portion, each operable wafer support having a wafer engaging portion comprising a wafer shelf, each wafer shelf corresponding to and positioned adjacent a respective one of the opposing sides, each wafer engaging portion and each corresponding wafer shelf being selectively shiftable between a first position and a second position, wherein at the first position each wafer shelf is closer to its respective opposing side than at the second position, and wherein when the wafer is seated on the wafer shelves, support of the wafer underneath the wafer at the sides of the wafer is provided exclusively by the wafer shelves at the first position and at the second position.

2. The combination of claim 1 wherein at the first position of each of the wafer engaging portions, the wafer engaging portions are positioned to enable the wafer to be inserted into the container to be seated on the wafer shelves and when seated on the wafer shelves with the wafer engaging portions in the first position, the wafer is not restrained from moving towards the open front of the enclosure portion.

3. The combination of claim 2, wherein when the wafer engaging portions are at the second position, a portion of each of the wafer engaging portions is shifted away from its respective opposing side of the enclosure portion and wherein, when the wafer is seated on the wafer engaging portions, each wafer engaging portion is engaged with and restrains the wafer from moving towards the open front.

4. The combination of claim 1, wherein each operable wafer support comprises an arm pivotally coupled with the enclosure portion at a pivot, and wherein the arm includes a first end comprising a door contacting portion, the arm connecting to a respective one of the wafer shelves, wherein the wafer engaging portion is moved from the first position to the second position by engaging the door with the door frame such that the door contacts the door contacting portion which causes the wafer engaging portion to pivot and its respective wafer shelf to move inwardly.

5. The combination of claim 4, further comprising a spring operably coupled and extending between the enclosure portion and the arm of each of the operable wafer supports, for providing bias to the arm toward the first position to allow insertion of the wafer into the enclosure portion when the door is not engaged with the door frame.

6. A container for at least one wafer comprising: an enclosure portion having a top, a bottom, a pair of opposing sides, a back and an opposing open front defined by a door frame; a door sealingly engageable in the door frame to close the open front thereby providing a sealed enclosure; a wafer restraint system in the enclosure including a wafer restraint positioned at the back of the enclosure portion and a pair of opposing operable wafer supports, each operable wafer support comprising a wafer engaging portion, each wafer engaging portion comprising a wafer shelf, each of the opposing operable wafer supports corresponding to and positioned adjacent a respective one of the opposing sides and being selectively shiftable between a first position and a second position, wherein when the opposing operable wafer supports are in the first position, the wafer shelves of the wafer engaging portions are positioned to enable the wafer to be inserted and seated on the wafer shelves, and when thereby seated, the wafer is not restrained by the wafer engaging portions from moving towards the open front of the enclosure portion, the wafer shelves of the wafer engaging portions, when in the first position and in the second position, extending underneath the wafer thereby providing under wafer support at two sides of the wafer adjacent to the respective opposing side of the enclosure portion, the wafer restraint system not providing any additional under wafer support at the two sides of the wafer.

7. The container for at least one wafer of claim 6, wherein when the operable wafer supports are at the second position, at least a portion of each of the wafer engaging portions is shifted inwardly with respect to its respective opposing side of the enclosure portion and wherein, when the wafer is seated on the wafer engaging portions, the wafer engaging portions are engaged with and restrain the wafer from moving towards the open front and the wafer shelves of the wafer engaging portions extend underneath the wafer to provide exclusive underneath support at the two sides of the wafer.

8. The container of claim 6, wherein each operable wafer support comprises an arm pivotally coupled with the enclosure portion at a pivot, and wherein the arm includes a first end comprising a door contacting portion and a second opposing end at the wafer engaging portion, and wherein the wafer engaging portion is moved from the first position to the second position by engaging the door with the door frame such that the door contacts the door contacting portion which causes the operable wafer engaging portion to pivot and its respective wafer shelf to move inwardly.

9. The container of claim 8, further comprising a spring operably coupled and extending between the enclosure portion and each of the arms to bias each of the arms toward the first position to allow insertion of the wafer into the enclosure portion when the door is not engaged with the door frame.

10. A container for holding wafers in an axially aligned, horizontal, generally parallel spaced apart arrangement, the container comprising: an enclosure portion having a closed top, a closed bottom, a pair of opposing closed sides, a closed back defining an open interior, and an open front defined by a door frame; a door sealingly engageable in the door frame to close the open front; and a wafer restraint system in the enclosure portion comprising a wafer restraint positioned at the closed back of the enclosure portion, a first plurality of wafer shelves arranged vertically on one side of the pair of opposing closed sides in the enclosure portion and a corresponding second plurality of wafer shelves arranged at the opposite side of the pair of opposing closed sides in the enclosure portion, the wafer shelves being selectively shiftable horizontally between a first position and a second position, underneath support for the wafers at the opposing closed sides of the enclosure portion being provided exclusively by the first and second pluralities of wafer shelves at the first position and at the second position.

11. The container of claim 10, wherein the enclosure portion further comprises a plurality of wafer engaging portions such that each of the wafer shelves is part of a respective one of said plurality of wafer engaging portions, and wherein when the wafer shelves are in the second position, each respective wafer engaging portion restrains a respective wafer from moving towards the open front of the enclosure portion, and wherein when the wafer shelves are in the first position, the wafers are not restrained from moving towards the open front of the enclosure portion.

12. The container of claim 10, wherein the enclosure portion further comprises a plurality of arms for engagement with the front door, each arm connecting to a respective wafer shelf of the first and second pluralities of wafer shelves and the plurality of arms pivotally connected with respect to the enclosure portion whereby said plurality of arms are engaged with the front door when the first and second pluralities of wafer shelves move from the first position to the second position.

13. The container of claim 12, further comprising a plurality of springs, each spring of said plurality of springs operably coupled and extending between the enclosure portion and a separate one of the arms to bias each of the arms such that the wafer shelves are in the first position to allow insertion of the wafer into the enclosure portion when the door is not engaged with the door frame.

14. A container for at least one wafer comprising: an enclosure portion having a top, a bottom, a pair of opposing sides, a back and an open front defined by a door frame; a door sealingly engageable with the door frame to close the open front thereby providing a sealed enclosure; a wafer restraint system in the enclosure portion including a pair of opposing operable wafer supports, each operable wafer support comprising a wafer engaging portion, each wafer engaging portion comprising a wafer shelf, each opposing operable wafer support corresponding to and positioned in conjunction with a respective one of the opposing sides and being selectively shiftable between a first position and a second position, wherein when the operable wafer supports are in the first position, the wafer shelves of the wafer engaging portions are positioned to enable the wafer to be inserted and seated on the wafer shelves, the wafer shelves of the wafer engaging portions, when in the first position and in the second position, extending underneath the wafer thereby providing under wafer support at two sides of the wafer adjacent to the respective opposing side of the enclosure portion, the wafer restraint system not providing any additional under wafer support at the two sides of the wafer.

* * * * *